(12) United States Patent
Choi et al.

(10) Patent No.: US 8,817,571 B2
(45) Date of Patent: Aug. 26, 2014

(54) SEMICONDUCTOR MEMORY DEVICE AND SEMICONDUCTOR MEMORY SYSTEM

(75) Inventors: Jang-seok Choi, Seoul (KR); Yong-hoon Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 436 days.

(21) Appl. No.: 13/105,970

(22) Filed: May 12, 2011

(65) Prior Publication Data
US 2011/0280086 A1    Nov. 17, 2011

(30) Foreign Application Priority Data

May 12, 2010    (KR) .......................... 10-2010-0044497

(51) Int. Cl.
    *G11C 8/20*    (2006.01)
(52) U.S. Cl.
    USPC ............. 365/230.06; 365/189.16; 365/189.06
(58) Field of Classification Search
    USPC ........................... 365/189.16, 189.06, 230.06
    See application file for complete search history.

(56) References Cited

U.S. PATENT DOCUMENTS

| 5,513,337 | A |   | 4/1996  | Gillespie et al. |
|-----------|---|---|---------|------------------|
| 5,623,636 | A |   | 4/1997  | Revilla et al. |
| 5,898,611 | A | * | 4/1999  | Yamada ........................ 365/154 |
| 6,101,587 | A | * | 8/2000  | Kim ............................. 711/163 |
| 6,751,716 | B2 | * | 6/2004 | Sumitani et al. .............. 711/164 |
| 2001/0055227 | A1 | * | 12/2001 | Takata et al. ................. 365/199 |
| 2002/0001233 | A1 | * | 1/2002 | Hotaka .................... 365/189.04 |
| 2004/0019754 | A1 | * | 1/2004 | Lin et al. ....................... 711/156 |
| 2006/0221718 | A1 | * | 10/2006 | Ono .......................... 365/189.04 |
| 2006/0239095 | A1 | * | 10/2006 | Shi et al. ....................... 365/222 |
| 2007/0133280 | A1 | * | 6/2007 | Oshiba et al. ............ 365/185.04 |

FOREIGN PATENT DOCUMENTS

| JP | 100260901 A | 9/1998 |
|----|-------------|--------|
| KR | 100234235 B1 | 9/1999 |

* cited by examiner

*Primary Examiner* — Hoai V Ho
*Assistant Examiner* — Jay Radke
(74) *Attorney, Agent, or Firm* — Volentine & Whitt, PLLC

(57) ABSTRACT

A semiconductor memory device comprises a memory cell array comprising a plurality of memory cells, and a filling command determiner that receives a command signal and an address signal and determines whether the command signal corresponds to a filling command. Upon determining that the command signal corresponds to a filling command, the filling command determiner connects a first source voltage to a bitline and connects a second source voltage to a complementary bitline corresponding to the bitline. The bitline is connected to a selected memory cell corresponding to the address signal.

19 Claims, 7 Drawing Sheets

US 8,817,571 B2

SEMICONDUCTOR MEMORY DEVICE AND SEMICONDUCTOR MEMORY SYSTEM

CROSS-REFERENCE TO RELATED APPLICATIONS

This application claims priority under 35 U.S.C. §119 to Korean Patent Application No. 10-2010-0044497 filed on May 12, 2010, the disclosure of which is hereby incorporated by reference in its entirety.

BACKGROUND OF THE INVENTION

Embodiments of the inventive concept relate generally to semiconductor memory technologies. More particularly, embodiments of the inventive concept relate to semiconductor memory devices and systems that perform control operations using hardware-based techniques.

Most computing systems use operating system (OS) software to prevent unauthorized processes from accessing memory areas containing secured data. This software, however, can slow down the performance of the computing systems.

SUMMARY OF THE INVENTION

According to one embodiment of the inventive concept, a semiconductor memory device comprises a memory cell array comprising a plurality of memory cells, and a filling command determiner that receives a command signal and an address signal and determines whether the command signal corresponds to a filling command. Upon determining that the command signal corresponds to a filling command, the filling command determiner connects a first source voltage to a bitline connected to a selected memory cell corresponding to the address signal and connects a second source voltage to a complementary bitline corresponding to the bitline.

According to another embodiment of the inventive concept, a semiconductor memory device comprises a memory unit comprising a memory cell array, and a filling controller that receives a command signal and an address signal and compares the address signal with a security address. Upon determining that the address signal matches the security address according to the comparison, the memory unit outputs predetermined data regardless of the data of memory cells corresponding to the address signal input to the filling controller.

According to another embodiment of the inventive concept, a method of operating a semiconductor device comprises receiving a command signal and an address signal, determining whether the command signal corresponds to a filling command, and upon determining that the command signal corresponds to a filling command, connecting a first source voltage to a bitline connected to a selected memory cell corresponding to the address signal, and connecting a second source voltage to a complementary bitline corresponding to the bitline.

These and other embodiments of the inventive concept can provide efficient performance while protecting secured data by using hardware based security techniques.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

Figure 1:
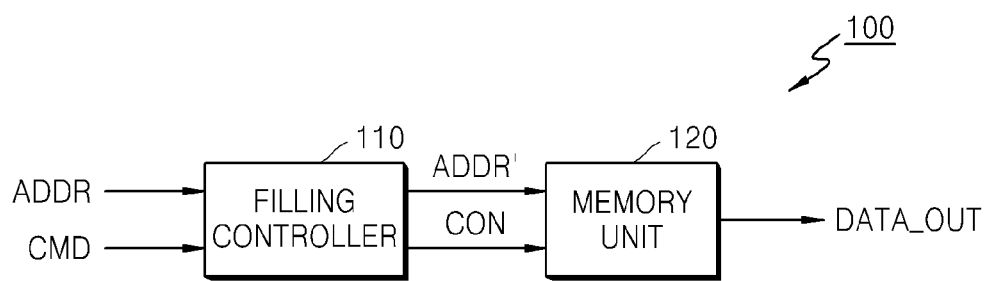
FIG. 1 is a block diagram of a semiconductor memory device according to an embodiment of the inventive concept.

FIG. 1 is a block diagram of a semiconductor memory device 100 according to an embodiment of the inventive concept.

Referring to FIG. 1, semiconductor memory device 100 comprises a filling controller 110 and a memory unit 120.

Filling controller 110 receives an address signal ADDR and a command signal CMD and outputs an address signal ADDR' and a control signal CON to memory unit 120. Memory unit 120 receives address signal ADDR' and control signal CON from filling controller 110 and generates and outputs output data DATA_OUT according to address signal ADDR' and control signal CON. Memory unit 120 typically comprises a memory cell array comprising a plurality of memory cells, a row decoder, a column decoder, and a data input/output circuit.

Filling controller 110 modifies address signal ADDR according to command signal CMD to generate address signal ADDR'. Memory unit 120 outputs data from a memory cell selected according to modified address signal ADDR' as output data DATA_OUT. Alternatively, filling controller 110 can output address signal ADDR to memory unit 120 without modification. In other words, filling controller 110 can output address signal ADDR as address signal ADDR'.

Filling controller 110 activates control signal CON according to address signal ADDR and command signal CMD and outputs the activated control signal CON to memory unit 120. In response to the activated control signal CON, memory unit 120 reads data from a memory cell corresponding to address signal ADDR' and writes data "0" or "1" into a memory cell corresponding to address signal ADDR'.

Alternatively, in response to activated control signal CON, memory unit 120 can output data DATA_OUT regardless of the data of the memory cell corresponding to address signal ADDR.

Figure 2:
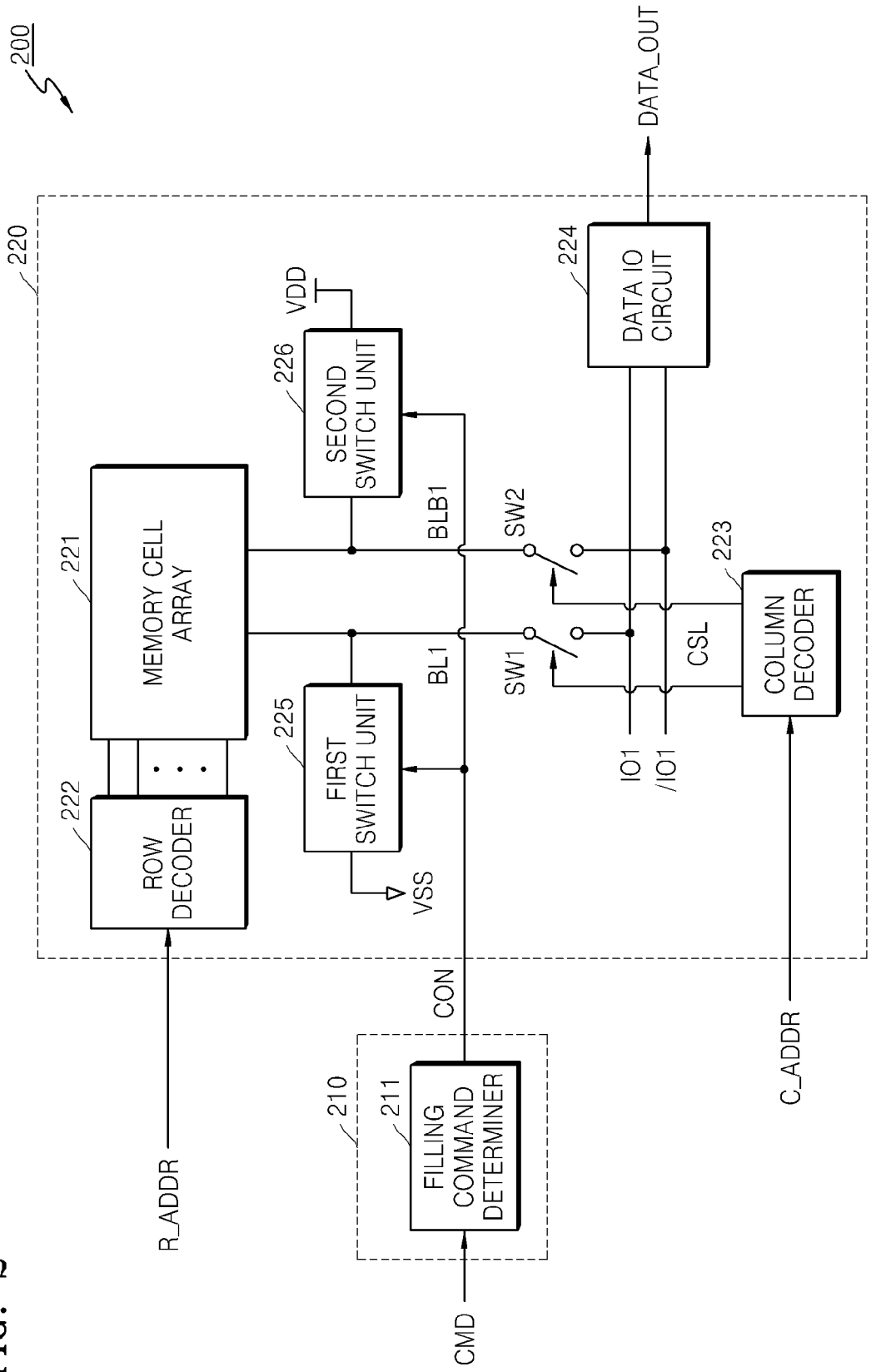
FIG. 2 is a block diagram of a semiconductor memory device according to an embodiment of the inventive concept.

FIG. 2 is a block diagram of a semiconductor memory device 200 according to an embodiment of the inventive concept. Semiconductor memory device 200 is a variation of semiconductor memory device 100 of FIG. 1.

Referring to FIG. 2, semiconductor memory device 200 comprises a filling controller 210 and a memory unit 220.

Filling controller 210 and memory unit 220 of FIG. 2 correspond to filling controller 110 and memory unit 120 of FIG. 1, respectively.

Memory unit 220 comprises a memory cell array 221, a row decoder 222, a column decoder 223, and a data input/output circuit 224. Memory unit 220 further comprises a first switch unit 225 and a second switch unit 226. Memory cell array 221 comprises a plurality of memory cells.

Row decoder 222 receives a row address signal R_ADDR from an external source and activates a wordline selected according to row address signal R_ADDR. Column decoder 223 receives a column address signal C_ADDR from an external source and outputs a column selection signal CSL according to column address signal C_ADDR. Column selection signal CSL controls activation (i.e., turning on or off) of switches SW1 and SW2 connected between a bitline BL1 and a complementary bitline BLB1 and data input/output lines IO1 and /IO1, respectively.

Data input/output circuit 224 receives data of bitline BL1 or complementary bitline BLB1 selected according to column selection signal CSL via data input/output line IO1 or /IO1 and outputs the received data as output data DATA_OUT. Meanwhile, a bitline sense amplifier (not shown) is included coupled to memory cell array 221 via bitlines BL1 and BLB1.

Filling controller 210 comprises a filling command determiner 211. Filling command determiner 211 receives command signal CMD and determines whether command signal CMD corresponds to a filling command. Where it is determined that command signal CMD corresponds to a filling command, filling command determiner 211 activates control signal CON and outputs the activated control signal CON to first switch unit 225 and second switch unit 226.

The filling command is used to prevent unauthorized processes from accessing secured data. The filling command can be performed under a page-close policy or a page-open policy. Under the page-close policy, semiconductor memory 200 activates a memory page according to address signal ADDR to perform a read operation and automatically writes over the data of the activated memory page after the read operation. Under the page-open policy, semiconductor memory device 200 can perform a read operation on a memory page selected according to address signal ADDR several times after the memory page is activated before the page is written over.

Where it is determined that command signal CMD corresponds to a filling command, filling command determiner 211 activates control signal CON in an operation of writing over the data after reading data of memory cell array 221 and outputs the activated control signal CON to first switch unit 225 and second switch unit 226. In response to the activated control signal CON, first switch unit 225 supplies a ground voltage VSS to bitline BL1, and second switch unit 226 supplies a source voltage VDD to complementary bitline BLB1 corresponding to bitline BL1. As a result, data in memory cell array 221 activated by row decoder 222 is changed to data of "0" regardless of originally stored data.

Similarly, by supplying source voltage VDD to bitline BL1 connected to memory cell array 221 and ground voltage VSS to complementary bitline BLB1, the data of memory cell array 221 activated by row decoder 222 can be changed to data of "1".

Using the above techniques, semiconductor memory device 200 prevents unauthorized processes from accessing secured data by totally rewriting data of any one of "0" and "1" in an operation of writing over secured data after reading the secured data.

In certain embodiments, semiconductor memory device 200 comprises a dynamic random access memory (DRAM), and the operation of writing over secured data is included in an operation of refreshing data. In other words, in certain embodiments, semiconductor memory device 200 replaces stored data with "0" or "1" during a DRAM refresh operation.

Although FIG. 2 illustrates a complementary pair of bitlines BL1 and BLB1, in other embodiments, bitlines and complementary bitlines can be connected between memory cell array 221 and column decoder 223.

First switch unit 225 is connected between bitline BL1 and ground voltage VSS, and second switch unit 226 is connected between complementary bitline BLB 1 and source voltage VDD. First switch unit 225 and second switch unit 226 receive control signal CON output from filling command determiner 211. Control signal CON is used to control activation (i.e., turning on or off) of first switch unit 225 and second switch unit 226. Where filling command determiner 211 determines that command signal CMD corresponds to a filling command, the activated control signal CON is input to first switch unit 225 and second switch unit 226, thereby turning on first switch unit 225 and second switch unit 226. As described above, control signal CON is activated in an operation of changing or writing over data after reading data of memory cell array 221 activated by row decoder 222.

Figure 3:
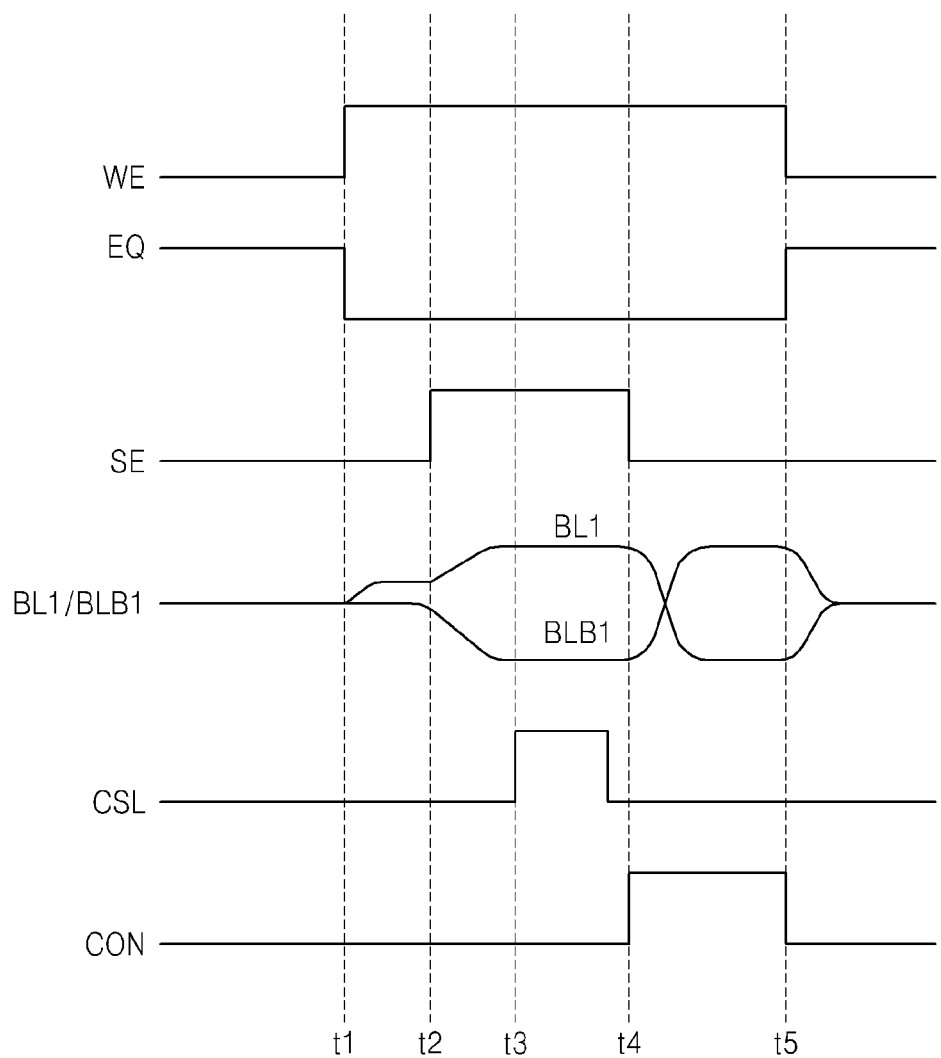
FIG. 3 is a timing diagram for describing operational characteristics of the semiconductor memory device of FIG. 2.

FIG. 3 is a timing diagram for describing operational characteristics of semiconductor memory device 200. In particular, FIG. 3 shows a timing diagram of a wordline enable signal WE, an equalizing signal EQ, a sense amplifier enable signal SE, bitline BL1 and complementary bitline BLB1, column selection signal CSL, and control signal CON. In the description of FIG. 3, it is assumed that command signal CMD input to filling command determiner 211 corresponds to a filling command and the data stored in a memory cell selected by row decoder 222 is "1".

Referring to FIG. 3, at a time t1, wordline enable signal WE, which is connected to the selected memory cell, is activated, and equalizing signal EQ is inactivated. Upon activation of wordline enable signal WE, a cell transistor of the selected memory cell is turned on. Where the selected memory cell stores "1", a cell capacitor of the selected memory cell is connected to bitline BL1 according to the turning-on of the cell transistor of the selected memory cell, so electrical charges stored in the cell capacitor of the selected memory cell are transferred to bitline BL1, thereby minutely increasing a voltage of bitline BL1. At this time, a voltage of complementary bitline BLB1 assumes an equalized voltage VDD/2.

At a time t2, sense amplifier enable signal SE is activated to amplify a voltage difference between bitline BL1 and complementary bitline BLB1. As a result, the voltage of bitline BL1 increases to source voltage VDD, and the voltage of complementary bitline BLB1 decreases to 0V.

At a time t3, column selection signal CSL is activated to turn on switches SW1 and SW2. Accordingly, the voltages of bitline BL1 and complementary bitline BLB1 are delivered to data input/output circuit 224 via data input/output lines IO1 and /IO1, respectively.

At a time t4, sense amplifier enable signal SE is inactivated, and control signal CON output from filling command determiner 211 is activated. Upon activation of control signal CON, first switch unit 225 and second switch unit 226 are turned on, so bitline BL1 is connected to ground voltage VSS and complementary bitline BLB1 is connected to source voltage VDD. Accordingly, the voltage of bitline BL1 decreases to 0V, and the voltage of complementary bitline BLB1 increases to source voltage VDD. At this time, wordline enable signal WE is still activated, so cell capacitors of the memory cells connected to bitline BL1 and complementary bitline BLB1 have the same voltages as bitline BL1 and complementary bitline BLB1.

Finally, at a time t5, wordline enable signal WE and control signal CON are inactivated, and equalizing signal EQ is activated, thereby pre-charging bitline BL1 and complementary bitline BLB1 to equalizing voltage VDD/2.

The data in the selected memory cell is "1" before data reading but is forcibly changed to "0" after the data reading. Accordingly, semiconductor memory device 200 prevents unauthorized processes from accessing secured data by changing the secured data to "0" after reading it. Alternatively, according to a change of ground voltage VSS connected to first switch unit 225 to source voltage VDD and a change of source voltage VDD connected to second switch unit 226 to ground voltage VSS, the secured data is changed to "1" to prevent an unauthorized processes from accessing the secured data.

Figure 4:
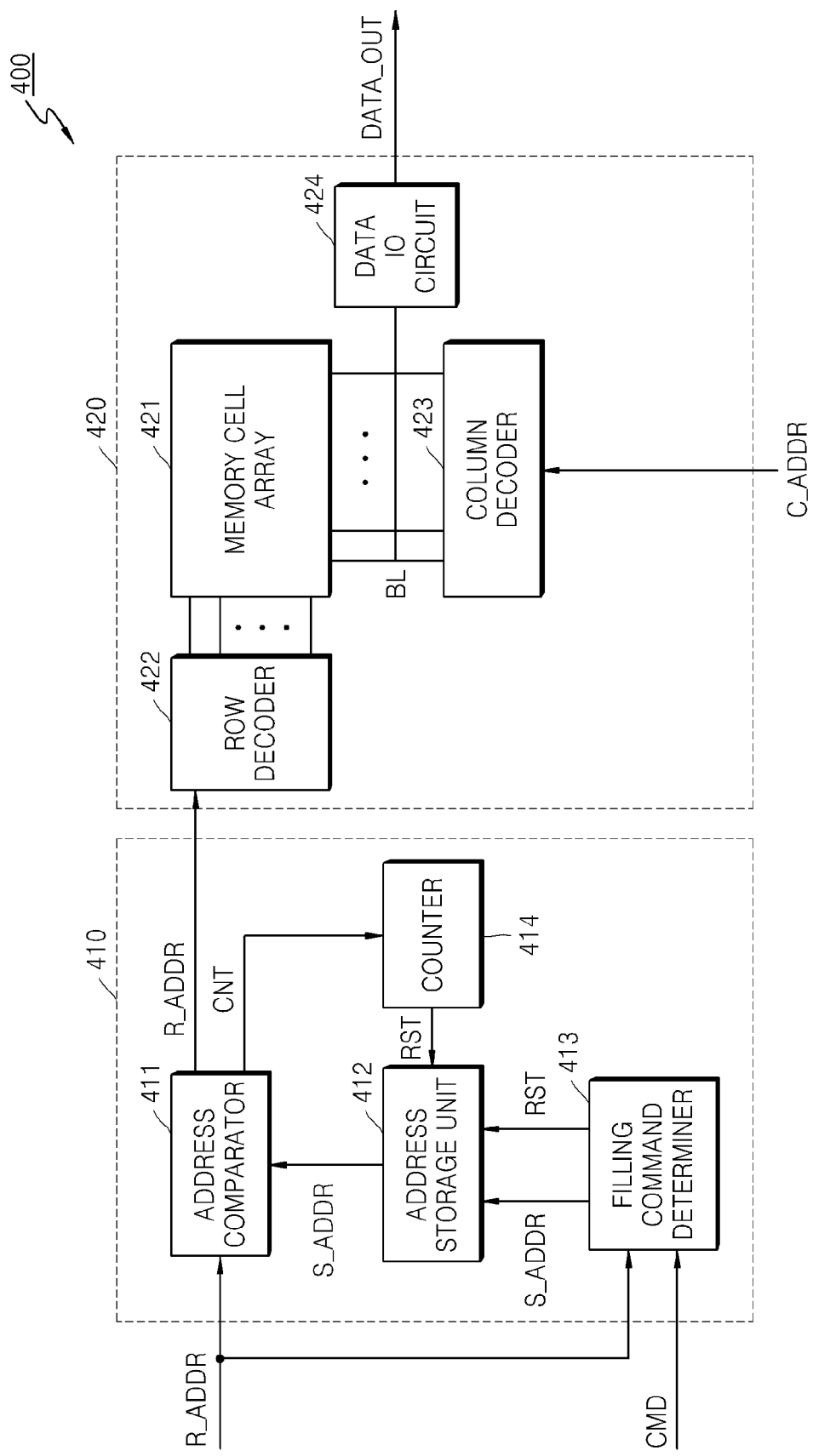
FIG. 4 is a block diagram of a semiconductor memory device according to an embodiment of the inventive concept.

FIG. 4 is a block diagram of a semiconductor memory device 400 according to an embodiment of the inventive concept. Semiconductor memory device 400 is another variation of semiconductor memory device 100 of FIG. 1.

Referring to FIG. 4, semiconductor memory device 400 comprises a filling controller 410 and a memory unit 420. Filling controller 410 and memory unit 420 shown in FIG. 4 correspond to filling controller 110 and memory unit 120 shown in FIG. 1, respectively.

Filling controller 410 receives command signal CMD and row address signal R_ADDR, compares row address signal R_ADDR with a security address S_ADDR, outputs row address signal R_ADDR to memory unit 420 without any change where row address signal R_ADDR does not match security address S_ADDR, and converts row address signal R_ADDR to a filling address and output the filling address to memory unit 420 where row address signal R_ADDR matches security address S_ADDR. Row address signal R_ADDR is a row address input to memory unit 420.

Security address S_ADDR is an address for indicating a memory area requiring security. Where it is determined that the received command signal CMD is a filling command, filling controller 410 stores the received row address signal R_ADDR as security address S_ADDR. The filling address is an address corresponding to a filling area in which only data of any one of "0" and "1" has been filled, in a memory cell array 421 included in memory unit 420.

Where row address signal R_ADDR does not match security address S_ADDR, filling controller 410 performs a typical memory operation by determining that an access to a memory area not requiring security is performed and outputting row address signal R_ADDR without any change. On the other hand, where row address signal R_ADDR matches security address S_ADDR, filling controller 410 may determine that an access to a memory area requiring security is performed, convert row address signal R_ADDR to a filling address, and output the filling address to a row decoder 422. Accordingly, because data of a filling area of a memory cell predetermined by a user is output from memory unit 420 instead of data of the memory area requiring security, the data of the memory area requiring security is prevented from access by unauthorized processes.

As shown in FIG. 4, filling controller 410 comprises an address comparator 411, an address storage unit 412, a filling command determiner 413, and a counter 414.

Address comparator 411 compares row address signal R_ADDR with security address S_ADDR. Where row address signal R_ADDR matches security address S_ADDR, address comparator 411 converts row address signal R_ADDR to a filling address and outputs the filling address to memory unit 420. Where row address signal R_ADDR does not match security address S_ADDR, address comparator 411 outputs row address signal R_ADDR to memory unit 420 without any change.

Address storage unit 412 stores security address S_ADDR input from filling command determiner 413. Address storage unit 412 provides the stored security address S_ADDR to address comparator 411 when address comparator 411 compares row address signal R_ADDR with security address S_ADDR.

Filling command determiner 413 receives command signal CMD and row address signal R_ADDR and determine whether command signal CMD corresponds to a filling command. Where command signal CMD corresponds to a filling command, filling command determiner 413 determines that the received row address signal R_ADDR corresponds to a security-required address and outputs row address signal R_ADDR to address storage unit 412 as security address S_ADDR.

Security address S_ADDR stored in address storage unit 412 can be deleted from address storage unit 412 where it is determined that security is no longer necessary. For example, where row address signal R_ADDR matches security address S_ADDR as a result of comparing row address signal R_ADDR with security address S_ADDR in address comparator 411, as described above, row address signal R_ADDR is converted to a filling address and output to memory unit 420, and simultaneously security address S_ADDR matching row address signal R_ADDR may be deleted from address storage unit 412. Accordingly, where row address signal R_ADDR corresponding to the deleted security address S_ADDR is input again, address comparator 411 outputs row address signal R_ADDR to memory unit 420 without converting to a filling address. That is, it is prevented only once for a non-authorized process to access a memory area corresponding to security address S_ADDR.

Counter 414 can be used to adjust a deleting time of security address S_ADDR stored in address storage unit 412. For instance, where row address signal R_ADDR matches security address S_ADDR as a result of comparing row address signal R_ADDR with security address S_ADDR in address comparator 411, address comparator 411 activates a matching signal CNT and outputs matching signal CNT to counter 414. Counter 414 counts the number of times in which row address signal R_ADDR matches security address S_ADDR, in response to the activated matching signal CNT. Where the number of times in which row address signal R_ADDR matches security address S_ADDR is equal to the number of times predetermined by the user, counter 414 activates a reset signal RST and outputs reset signal RST to address storage unit 412. Address storage unit 412 deletes security address S_ADDR therefrom in response to the activated reset signal RST input from counter 414.

Address storage unit 412 of FIG. 4 can store multiple security addresses S_ADDR. Accordingly, address comparator 411 can deliver to counter 414 which one of security addresses S_ADDR stored in address storage unit 412 matches the received row address signal R_ADDR. Counter 414 can include registers to store the number of times in which each security address S_ADDR stored in address storage unit 412 matches the received row address signal R_ADDR. In this case, counter 414 can provide information regarding a security address S_ADDR to be deleted from address storage unit 412 together with reset signal RST to address storage unit 412.

Command signal CMD input to filling command determiner 413 can correspond to a reset command. Where command signal CMD input from the outside corresponds to a reset command, filling command determiner 413 outputs the received row address signal R_ADDR to address storage unit 412 as a security address S_ADDR and outputs an activated reset signal RST to address storage unit 412. Address storage unit 412 deletes the received security address S_ADDR therefrom in response to the activated reset signal RST.

Referring to FIG. 4, memory unit 420 comprises memory cell array 421, row decoder 422, a column decoder 423, and a data input/output circuit 424. Memory cell array 421 comprises a plurality of memory cells. Row decoder 422 receives row address signal R_ADDR from filling controller 410 and enables a wordline of a memory cell array corresponding to row address signal R_ADDR. Column decoder 423 receives column address signal C_ADDR and selects a bitline of a memory cell array corresponding to column address signal C_ADDR. Data input/output circuit 424 outputs data of the bitline selected by column decoder 423 to an external destination.

Memory cell array 421 comprises a filling area in which only data "0" or "1" has been filled. Where row address signal R_ADDR matches security address S_ADDR, address comparator 411 outputs a filling address to prevent unauthorized processes from accessing secured data.

Figure 5:
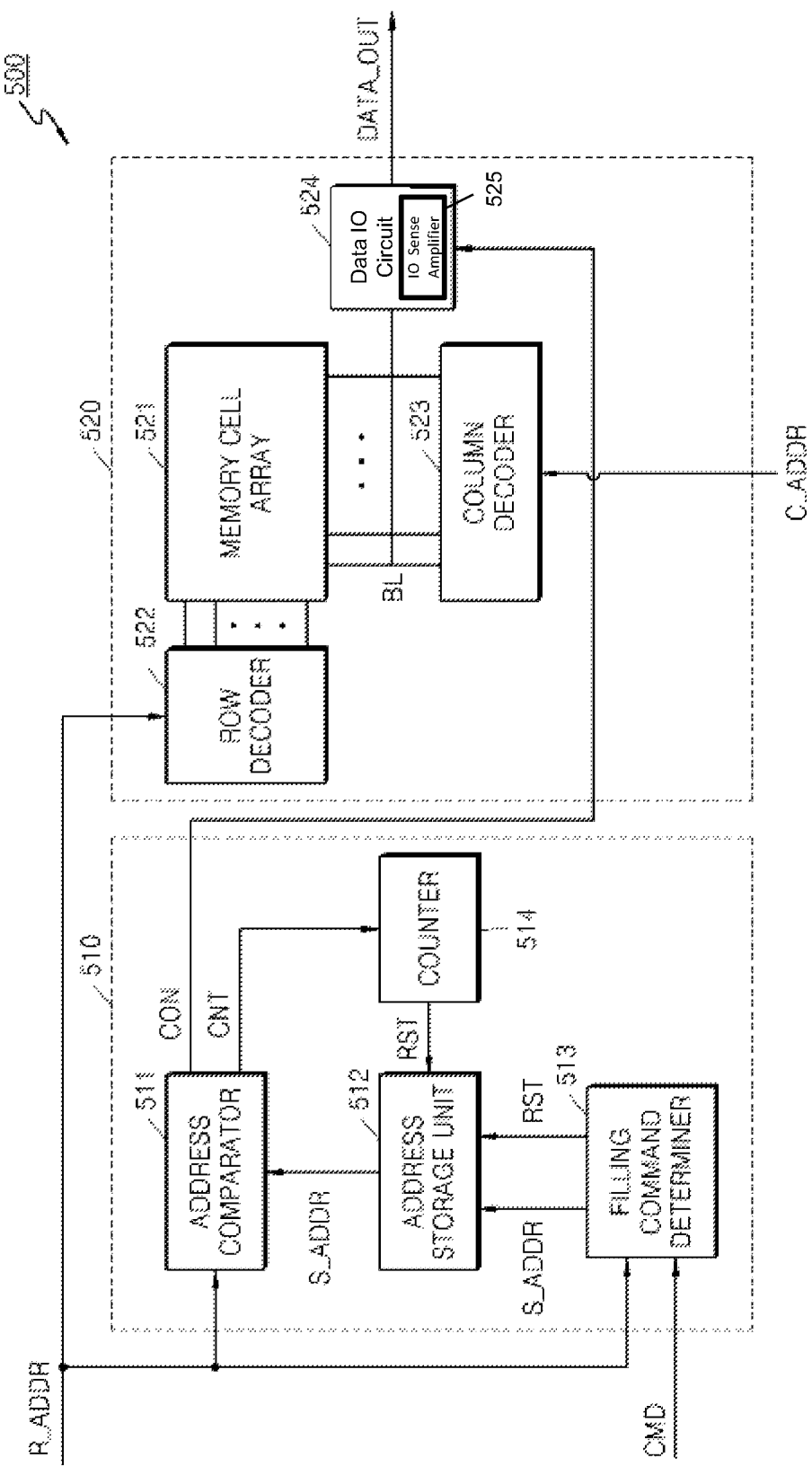
FIG. 5 is a block diagram of a semiconductor memory device according to an embodiment of the inventive concept.

FIG. 5 is a block diagram illustrating a semiconductor memory device 500 according to an embodiment of the inventive concept.

Referring to FIG. 5, semiconductor memory device 500 comprises a filling controller 510 and a memory unit 520. Filling controller 510 and memory unit 520 correspond to filling controller 110 and memory unit 120 of FIG. 1, respectively.

Filling controller 510 receives command signal CMD and row address signal R_ADDR, compares row address signal R_ADDR with security address S_ADDR, outputs an inactivated control signal CON where row address signal R_ADDR does not match security address S_ADDR, and outputs an activated control signal CON where row address signal R_ADDR matches security address S_ADDR.

Memory unit 520 comprises a memory cell array 521, a row decoder 522, a column decoder 523, and a data input/output circuit 524. Data input/output circuit 524 is controlled to output data of any one predetermined from "0" and "1" regardless of data of a memory cell corresponding to address signals R_ADDR and C_ADDR in response to the activated control signal CON input from filling controller 510. On the other hand, data input/output circuit 524 outputs data of a memory cell corresponding to address signals R_ADDR and C_ADDR in response to the inactivated control signal CON.

Filling controller 510 comprises an address comparator 511, an address storage unit 512, and a filling command determiner 513. Filling controller 510 further comprises a counter 514.

Address comparator 511 compare row address signal R_ADDR with security address S_ADDR. Where row address signal R_ADDR matches security address S_ADDR, address comparator 511 activates control signal CON and outputs the activated control signal CON to memory unit 520.

Address storage unit 512 stores security address S_ADDR input from filling command determiner 513. Address storage unit 512 provides the stored security address S_ADDR to address comparator 511 when address comparator 511 compares row address signal R_ADDR with security address S_ADDR.

Filling command determiner 513 receives command signal CMD and row address signal R_ADDR and determines whether command signal CMD corresponds to a filling command. Where command signal CMD corresponds to a filling command, filling command determiner 513 determines whether row address signal R_ADDR corresponds to a security-required address. Upon determining that row address signal R_ADDR corresponds to a security-required address, filling command determiner 513 outputs row address signal R_ADDR to address storage unit 512 as security address S_ADDR.

As described above with reference to FIG. 4, security address S_ADDR stored in address storage unit 512 can be deleted from address storage unit 512 where it is determined that security is no longer necessary. Various methods of deleting security address S_ADDR are described with reference to FIG. 4, so a further description is omitted in order to avoid redundancy.

Data input/output circuit 524 of memory unit 520 outputs data "0" or "1" in response to the activated control signal CON input from filling controller 510. Data input/output circuit 524 outputs data "0" or "1" regardless of the data of the memory cell corresponding to address signals R_ADDR and C_ADDR by forcibly biasing an input/output sense amplifier 525 included therein in response to the activated control signal CON.

Although filling controllers 410 or 510 of FIGS. 4 and 5 compare row address signal R_ADDR with security address S_ADDR, in other embodiments, filling controller 410 or 510 can compare at least one of a row address signal R_ADDR and a column address signal C_ADDR with a security address S_ADDR. In some embodiments, a semiconductor memory device comprises both a filling controller corresponding to row address signal R_ADDR and a filling controller corresponding to column address signal C_ADDR.

Figure 6:
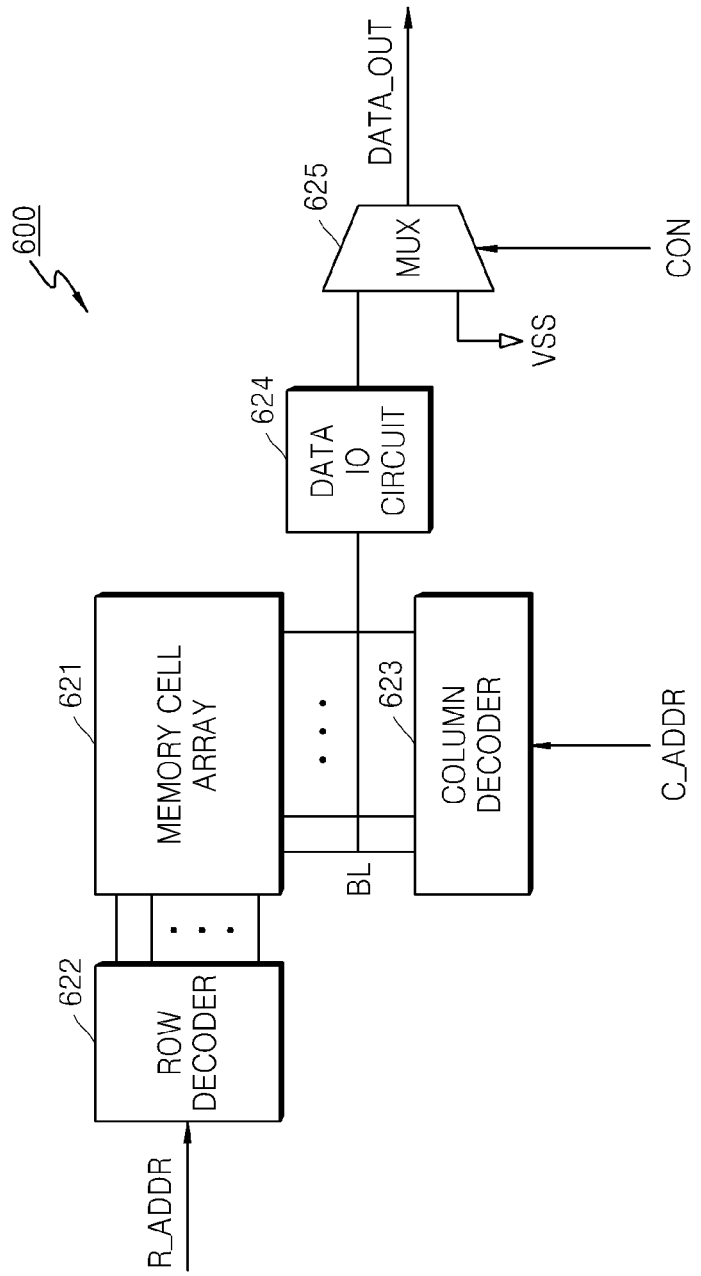
FIG. 6 is a block diagram of a memory unit in the semiconductor memory device of FIG. 5 according to an embodiment of the inventive concept.

FIG. 6 is a block diagram of a memory unit 600 according to another embodiment of the inventive concept. Memory unit 600 is a variation of memory unit 520 of FIG. 5.

Referring to FIG. 6, memory unit 600 comprises a memory cell array 621, a row decoder 622, a column decoder 623, and a data input/output circuit 624. Unlike memory unit 520 of FIG. 5, memory unit 600 further comprises a multiplexer 625.

A first input end of multiplexer 625 is connected to an output end of data input/output circuit 624, and a second input end of multiplexer 625 is connected to a ground voltage VSS. Multiplexer 625 selectively outputs an output of data input/output circuit 624 or ground voltage VSS in response to control signal CON input from filling controller 510.

Where control signal CON is activated, row address signal R_ADDR matches security address S_ADDR, so multiplexer 625 outputs ground voltage VSS instead of the output of data input/output circuit 624 as output data DATA_OUT. On the other hand, multiplexer 625 outputs the output of data input/output circuit 624 as output data DATA_OUT in response to an inactivated control signal CON.

Accordingly, where row address signal R_ADDR matches security address S_ADDR, memory unit 600 prevents unauthorized processes from accessing security-required data by outputting data "0" regardless of data stored in a memory cell corresponding to address signals R_ADDR and C_ADDR.

Ground voltage VSS connected to the second input end of multiplexer 625 is only an illustration, and it can be set to output data "1" in response to the activated control signal CON by connecting a source voltage VDD to the second input end of multiplexer 625.

Figure 7:
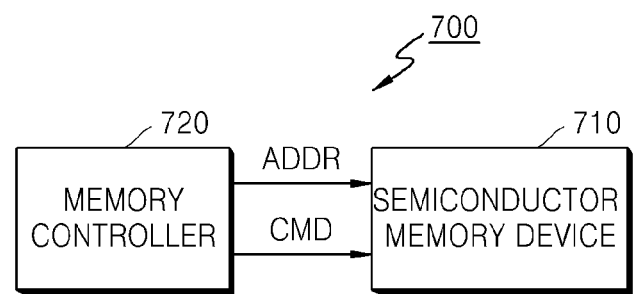
FIG. 7 is a block diagram of a semiconductor memory system according to an embodiment of the inventive concept.

FIG. 7 is a block diagram of a semiconductor memory system 700 according to an embodiment of the inventive concept.

Referring to FIG. 7, semiconductor memory system 700 comprises a semiconductor memory device 710 and a memory controller 720. Semiconductor memory device 710 can be implemented similar to one of the embodiments of FIGS. 1 through 6.

Memory controller 720 provides a filling command as command signal CMD to semiconductor memory device 710 to set a security-required data area. Memory controller 720 can also provide a reset command to semiconductor memory device 710 to delete an address corresponding to an area not requiring security. Operations of semiconductor memory device 710 in response to the filling command and the reset command are similar to those described with respect to FIGS. 1 through 6, so a description thereof will be omitted in order to avoid redundancy.

Figure 8:
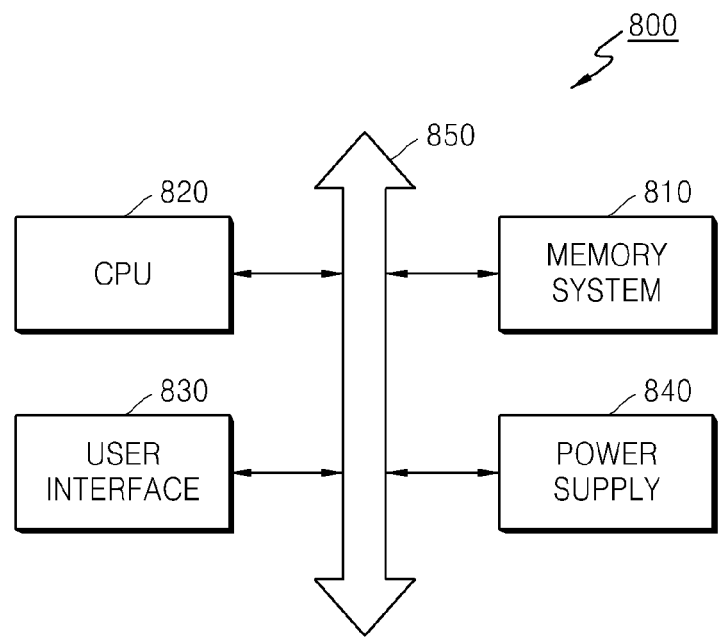
FIG. 8 is a block diagram of a computing system comprising a semiconductor memory system according to an embodiment of the inventive concept.

FIG. 8 is a block diagram of a computing system 800 comprising a semiconductor memory system according to an embodiment of the inventive concept.

Referring to FIG. 8, computing system 800 comprises a semiconductor memory system 810, a microprocessor 820, a user interface 830, and a power supply 840, which are electrically connected to a bus 850.

Semiconductor memory system 810 can be implemented similar to semiconductor memory system 700 of FIG. 7. Where computing system 800 is a mobile device, a battery for supplying an operational voltage of computing system 800 may be additionally included.

The above-described semiconductor memory devices and semiconductor memory systems can be packaged in a variety of package types or configurations. For example, the semiconductor memory device or the semiconductor memory systems can be packaged in configurations such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A semiconductor memory device comprising:
a memory cell array comprising a plurality of memory cells; and
a secured data access command determiner that receives a command signal and an address signal and determines whether the command signal corresponds to a command for accessing secured data,
wherein, as a consequence of the secured data access command determiner determining that the command signal corresponds to a command for accessing secured data, the semiconductor memory device reads data from a selected memory cell corresponding to the address signal, and then the secured data access command determiner connects a first source voltage to a bitline connected to the selected memory cell and connects a second source voltage to a complementary bitline corresponding to the bitline.

2. The semiconductor memory device of claim 1, wherein the semiconductor memory device further comprises:
a first switch unit connected between the bitline and the first source voltage; and
a second switch unit connected between the complementary bitline and the second source voltage,
wherein, upon determining that the command signal corresponds to a command for accessing secured data, the secured data access command determiner turns on the first switch unit and the second switch unit by activating a control signal input to the first switch unit and the second switch unit.

3. The semiconductor memory device of claim 2, wherein, upon determining that the command signal corresponds to a command for accessing secured data, the secured data access command determiner turns on the first switch unit and the second switch unit in an operation storing data of a predetermined state in the selected memory cell.

4. The semiconductor memory device of claim 3, wherein the selected memory cell is a dynamic random access memory (DRAM) cell and the operation is a refresh operation of the DRAM cell.

5. A semiconductor memory device comprising:
a memory unit comprising a memory cell array; and
a controller that receives a command signal and an address signal and compares the address signal with a security address,
wherein, upon determining that the address signal matches the security address according to the comparison, the memory unit outputs data of a predetermined state regardless of data stored in a selected memory cell corresponding to the address signal
wherein the controller comprises an address storage unit that stores the security address, and a secured data access command determiner that receives the command signal and the address signal and outputs the address signal to the address storage unit when the command signal corresponds to a command for accessing secured data, and the address storage unit stores an address output from the secured data access command determiner as the security address.

6. The semiconductor memory device of claim 5, wherein, upon determining that the address signal matches the security address according to the comparison, the controller converts the address signal to a filling address and outputs the filling address to the memory unit,
wherein the filling address is an address corresponding to a filling area, and the data of the predetermined state is data stored in the filling area.

7. The semiconductor memory device of claim 6, wherein the filling area is filled only with data "0" or "1".

8. The semiconductor memory device of claim 6, wherein the controller comprises:
an address comparator that compares the address signal with the security address, converts the address signal to the filling address, and outputs the filling address to the memory unit if the address signal matches the security address, and outputs the address signal to the memory unit if the address signal does not match the security address.

9. The semiconductor memory device of claim 8, wherein the address comparator deletes the security address from the address storage unit when the address signal matches the security address.

10. The semiconductor memory device of claim 8, wherein the address comparator further comprises a counter that counts a number of times that the address signal matches the security address, and
the controller deletes the security address matching the address signal from the address storage unit when the number of times counted by the counter is equal to a predetermined number.

11. The semiconductor memory device of claim 8, wherein the secured data access command determiner outputs the address signal and an activated reset signal to the address storage unit when it is determined that the command signal corresponds to a reset command, and
the address storage unit deletes the address signal from the address storage unit in response to the activated reset signal.

12. The semiconductor memory device of claim 6, wherein the memory unit further comprises:
a row decoder that receives the address signal output from the controller as a row address and enables a wordline of the memory cell array corresponding to the row address;
a column decoder that receives a column address and selects a bitline of the memory cell array corresponding to the column address; and
a data input/output circuit that outputs data of the bitline selected by the column decoder.

13. The semiconductor memory device of claim 5, wherein the controller outputs an activated control signal when the address signal matches the security address, and the memory unit outputs data "0" or "1" as the security data regardless of data stored in a memory cell corresponding to the address signal in response to the activated control signal.

14. The semiconductor memory device of claim 13, wherein the controller comprises:
an address comparator that compares the address signal with the security address, activates the activated control signal when the address signal matches the security address, and outputs the activated control signal to the memory unit; and
an address storage unit that stores the security address.

15. The semiconductor memory device of claim 14, wherein the controller further comprises a secured data access command determiner that receives the command signal and the address signal and outputs the address signal to the address storage unit when it is determined that the command signal corresponds to a command for accessing secured data, and
wherein the address storage unit stores an address output from the filling command determiner as the security address.

16. The semiconductor memory device of claim 15, wherein the address comparator deletes the security address from the address storage unit when the address signal matches the security address.

17. The semiconductor memory device of claim 13, wherein the memory unit further comprises:
a row decoder that receives the address signal as a row address and enables a wordline of the memory cell array corresponding to the row address;
a column decoder that receives a column address and selects a bitline of the memory cell array corresponding to the column address; and
a data input/output circuit that outputs data of the bitline selected by the column decoder, and
wherein the memory unit outputs data "0" or "1" regardless of data stored in a memory cell corresponding to the address signal by forcibly biasing an input/output sense amplifier in the data input/output circuit in response to the activated control signal.

18. The semiconductor memory device of claim 12, wherein the memory unit further comprises a multiplexer having a first input end that receives an output of the data input/output circuit and a second input end that receives a first source voltage, and selectively outputs the output of the data input/output circuit or the first source voltage in response to an activated control signal.

19. A method of operating a semiconductor device, comprising:
receiving a command signal and an address signal;
determining whether the command signal corresponds to a command for accessing secured data; and
as a consequence of determining that the command signal corresponds to a command for accessing secured data, reading data from a selected memory cell corresponding to the address signal, and then connecting a first source voltage to a bitline connected to the selected memory cell and connecting a second source voltage to a complementary bitline corresponding to the bitline.

* * * * *